Sept. 5, 1967 J. S. KILBY 3,340,406
INTEGRATED SEMICONDUCTIVE CIRCUIT STRUCTURE
Original Filed May 6, 1959 3 Sheets-Sheet 1

INVENTOR
Jack S. Kilby
BY Kenneth R. Glaser
ATTORNEYS

INVENTOR
Jack S. Kilby
BY Kenneth R. Glaser
ATTORNEYS

Sept. 5, 1967 J. S. KILBY 3,340,406
INTEGRATED SEMICONDUCTIVE CIRCUIT STRUCTURE
Original Filed May 6, 1959 3 Sheets-Sheet 3

INVENTOR
Jack S. Kilby
BY Kenneth R. Glaser
ATTORNEYS 3,340,406
INTEGRATED SEMICONDUCTIVE CIRCUIT STRUCTURE Jack S. Kilby, Dallas, Tex., assignor to Texas Instruments Incorporated, Dallas, Tex., a corporation of Delaware Application Aug. 14, 1962, Ser. No. 218,206, which is a continuation of application Ser. No. 811,476, May 6, 1959. Divided and this application Jan. 24, 1967, Ser. No. 611,363
19 Claims. (Cl. 307—88.5)

Figure 1:
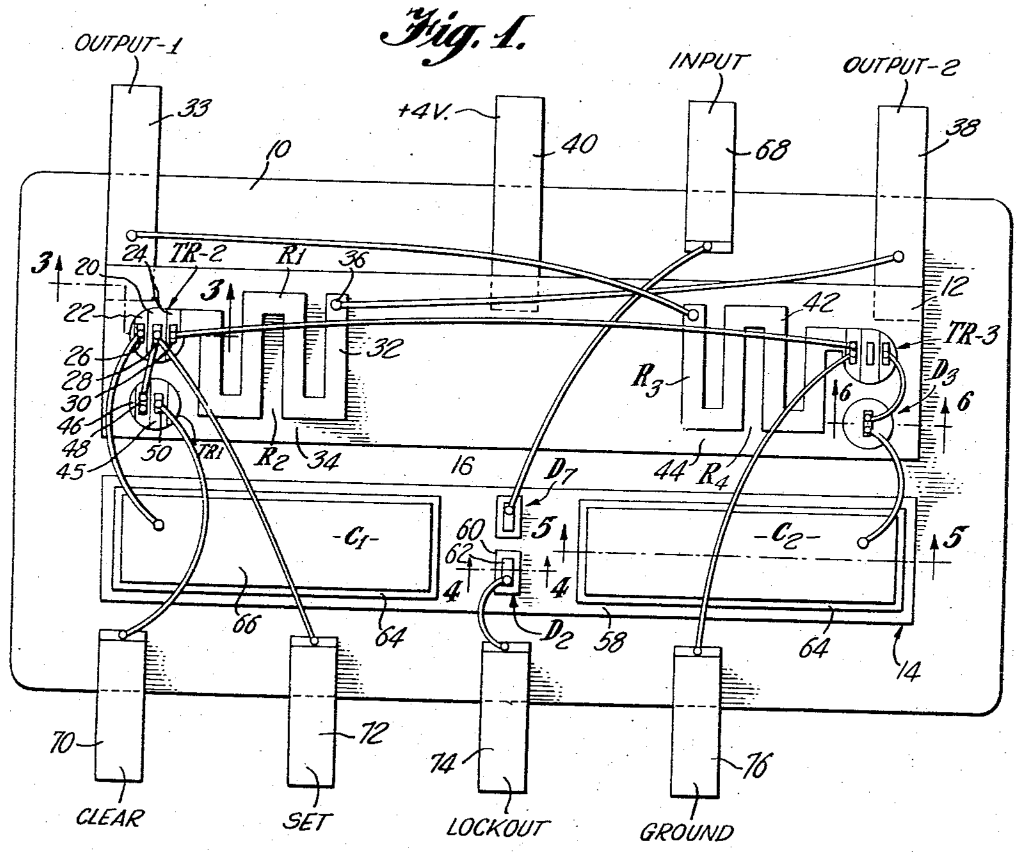

This invention relates broadly to miniature semiconductor network devices and more particularly to a miniature semiconductor network adapted for use in a bistable multivibrator, for example.

This is a divisional application of my pending application, Ser. No. 218,206, filed Aug. 14, 1962, which in turn was a continuation of application Ser. No. 811,476, filed May 6, 1959, now abandoned.

Many methods and techniques for miniaturizing electronic circuits have been proposed in the past. At first, most of the effort was spent upon reducing the size of the components and packing them more closely together. Work directed toward reducing component size is still going on, but has nearly reached a limit. Other efforts have been made to reduce the size of electronic circuits, such as by eliminating the protective coverings from components, by using more or less conventional techniques to form the components of a complete circuit on a single substrate, and by providing the components with a uniform size and shape to permit closer spacings in the circuit packaging therefor.

All of these methods and techniques require a very large number and variety of operations in fabricating a complete circuit. For example, of all circuit components, resistors are usually considered the most simple to form, but when adapted for miniaturization by conventional techniques, fabrication requires at least the following steps:

(a) Formation of the substrate,
(b) Preparation of the substrate,
(c) Application of terminations,
(d) Preparation of resistor material,
(e) Application of the resistor material,
(f) Heat treatment of the resistor material,
(g) Protection or stabilization of the resistor.

Capacitors, transistors, and diodes, when adapted for miniaturization, each require at least as many steps in the fabrication thereof. Unfortunately, many of the steps required are not compatible. A treatment that is desirable for the protection of a resistor may damage another element formed on the same substrate, such as a capacitor or transistor, and as the size of the complete circuit is reduced, such conflicting treatments, or interactions, become of increasing importance. Interactions may be minimized by forming the components separately and then assembling them into a complete package, but the very act of assembly may cause damage to the more sensitive components.

Because of the large number of operations required, control over miniaturized circuit fabrication becomes very difficult. To illustrate, many raw materials must be evaluated and controlled, even though they may not be well understood. Further, many testing operations are required and, even though a high yield may be obtained for each operation, so many operations are required that the overall yield is often quite low. In service, the reliability of a circuit produced by methods of such complexity may also be quite low due to the tremendous number of controls required. Additionally, the separate formation of individual components requires individual terminations for each component. These terminations may eventually become as small as a dot of conductive paint. However, they still account for a large fraction of the usable area or volume of the circuit, and may become an additional cause of circuit failure or rejection due to misalignment.

In contrast to the approaches to miniaturization that have been made in the past, the present invention has resulted from a new and totally different concept for miniaturization. This concept and circuit elements made in accordance with this concept are the subject matter of a pending application, Ser. No. 791,602, filed Feb. 6, 1959, now U.S. Patent 3,138,743 and assigned to the same assignee as this application. Radically departing from the teachings of the prior art, it is proposed in that pending application that the ultimate in circuit miniaturization may be attained by using only one material for all circuit elements and a limited number of compatible process steps for the production thereof.

The above is accomplished by utilizing a body of semiconductor material exhibiting one type of conductivity, either N-type or P-type, and having formed therein a diffused region or regions of appropriate conductivity type to form a P-N junction between such region or regions and the semiconductor body or, as the case may be, between diffused regions. According to the principles of this invention, all components of a bistable multivibrator circuit are fabricated within the body so characterized by adapting the novel techniques described in said pending application, together with certain new techniques. It is to be noted that all components of the circuit are originally formed into a single body of semiconductor material and constitute portions thereof.

In a more specific conception of this invention, all components of a bistable multivibrator circuit are originally formed in or near one surface of a relatively thin semiconductor wafer characterized by a diffused P-N junction or junctions. Of importance to this invention is the concept of shaping. As described in detail in said pending application, this shaping concept makes it possible in a circuit to obtain the necessary isolation between components and to define the components or, stated differently, to limit the area which is utilized for a given component. Shaping may be accomplished in a given circuit in one or more of several different ways. These various ways include actual removal of portions of the semiconductor material, specialized configurations of the semiconductor material, such as rectangles, L shapes, U shapes, etc., selective conversion of intrinsic semiconductor material by diffusion of impurities thereinto to provide low resistivity paths for current flow, and selective conversion of semiconductor material of one conductivity type to conductivity of the opposite type wherein the P-N junction thereby formed acts as a barrier to current flow. In any event, the effect of shaping is to direct and/or confine paths for current flow, thus permitting the fabrication of circuits which could not otherwise be obtained in a single wafer of semiconductor material. As a result, the final circuit is arranged in essentially planar form. It is possible to shape the wafer during processing and to produce by diffusion the various circuit elements in a desired and proper relationship.

Certain of the circuit components described in said pending application have utility in and of themselves; however, they perhaps find their greatest utility as integral parts of miniature semiconductor network devices. Therefore, it is the principal object of this invention to provide a novel miniaturized semiconductor network device which functions as a bistable multivibrator.

It is another principal object of this invention to provide a miniature semiconductor network bistable multivibrator circuit including diode gate circuits.

It is still another principal object of this invention to provide a miniature semiconductor network diode gate in combination with a reverse-biased diode for providing a bias to the gate.

It is a further object of this invention to provide a miniature semiconductor gated multivibrator circuit fabricated from a single body of semiconductor material containing a plurality of diffused P-N junctions wherein all components of the diode gate are fabricated completely within the original body of semiconductor material, portions of the body being isolated from one another to prevent interference between different circuit elements.

It is still another object of this invention to provide a unique miniaturized bistable multivibrator circuit structure which is substantially smaller, more compact and simpler than circuit packages heretofore developed using known techniques.

Figure 2A:
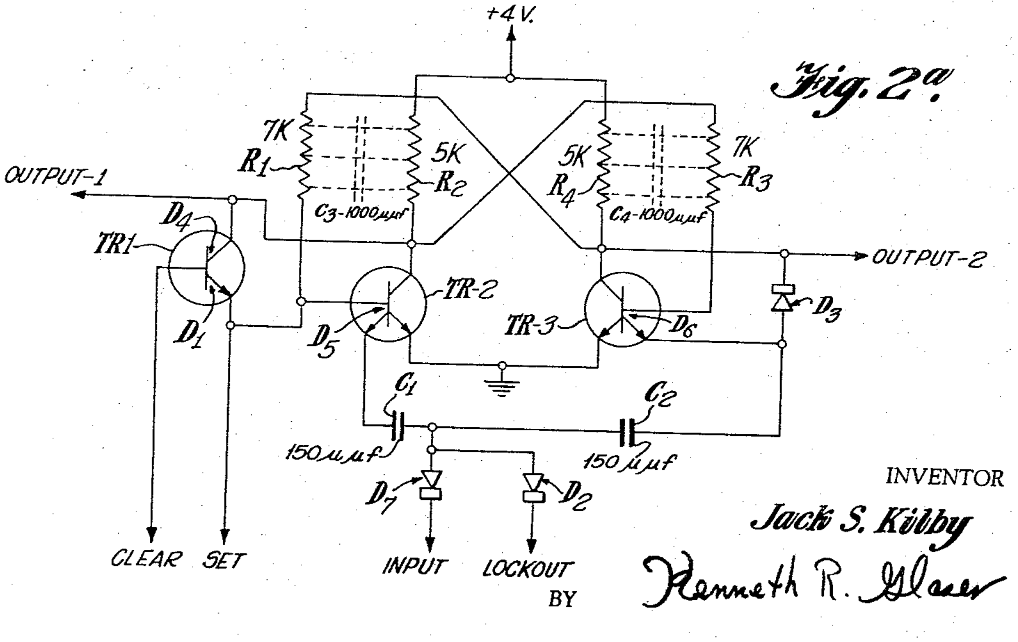
Figure 2B:
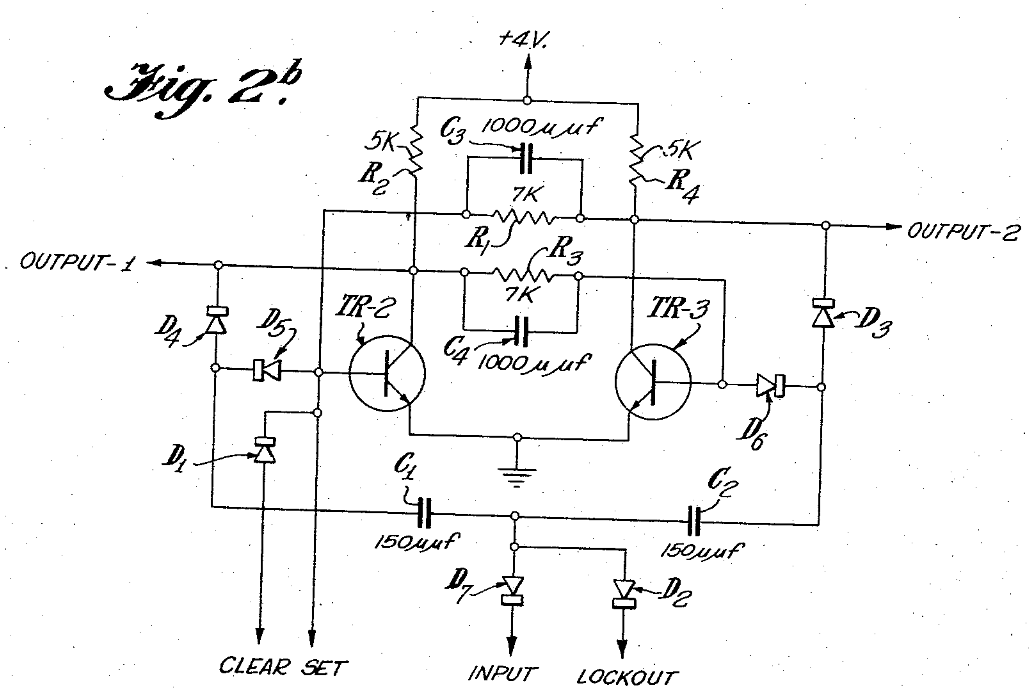
Figure 2C:
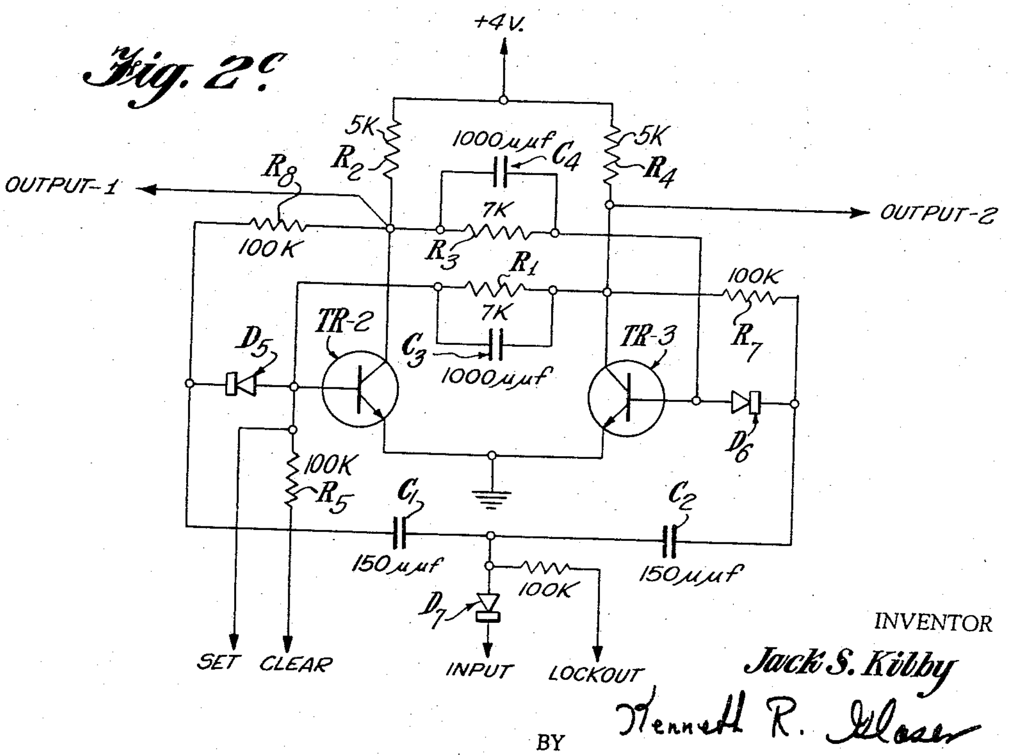

Other and further objects of the present invention will become more readily apparent from the folowing detailed description of the preferred embodiment of the invention when taken in conjunction with the appended drawings, in which:

FIGURE 1 illustrates a top plan view of a miniature semiconductor network gated bistable multivibrator embodying this invention;

FIGURE 2*a* illustrates a schematic circuit diagram of the semiconductor network illustrated in FIGURE 1;

FIGURE 2*b* and FIGURE 2*c* illustrate circuit diagrams showing variations in the circuit illustrated in FIGURES 1 and 2*a*. In addition, FIGURES 2*b* and 2*c* illustrate the manner in which back-biased P–N junction diodes may be substituted for high-valued bias resistors in diode gate circuits; and FIGURES 3–6, inclusive, show cross sectional views of some of the semiconductor network components illustrated in FIGURE 1.

With reference to the drawings, preferred embodiments of the present invention will now be described in detail in order to provide a better understanding of the principles of the invention and the various forms and embodiments of the invention.

As noted previously, this invention is primarily concerned with providing miniature electronic circuits. Also, as noted, the invention contemplates the use of a body of semiconductor material appropriately shaped and having formed therein diffused P-N junctions and components designed for the various circuit elements which can be integrated into or which constitute parts of the aforesaid body of semiconductor material.

FIGURES 1–5, inclusive, of said pending application illustrate in detail circuit elements which can be formed into a body of semiconductor material. It is noted at this point that the body of semiconductor material is of single crystal structure, and can be composed of any suitable semiconductor material. Examples of such suitable material are germanium, silicon, intermetallic alloys such as gallium arsenide, aluminum antimonide, indium antimonide, as well as others.

With particular reference to FIGURE 1, there is shown a miniature semiconductor network which provides gated bistable multivibrator operation. Mounted on substrate 10 by solder glass are strips 12 and 14 of single crystal semiconductor material. The space 16 between these two strips was formed by originally starting with a single larger strip of semiconductor material and etching to divide the crystal into two portions. However, the purpose of this shaping operation is to provide isolation between the circuit components integrated with strips 12 and 14, and it is to be understood that substantial electrical isolation could be obtained by means other than etching completely through a larger crystal strip to form two strips; for example, electrical isolation could be provided by a high resistance area in the crystal between circuit components desired to be isolated. This high resistance will provide a substantial open circuit to prevent undesired interference between the circuit components involved.

However, in the embodiment shown in FIGURE 1, isolation between two portions of the multivibrator circuit is provided by etching the space 16 in an original crystal to form two crystal strips 12 and 14 which are physically separate, one from the other.

As described in said copending application, the original crystal is first completely diffused with a layer of P-type semiconductor material to form a P-N junction. Circuit components are then formed therein by selective etching of the semiconductor material and by selectively diffusing N-type material into the P layer. Metal contacts may then be plated or evaporated onto desired layers to form electrical connections.

Figure 3:
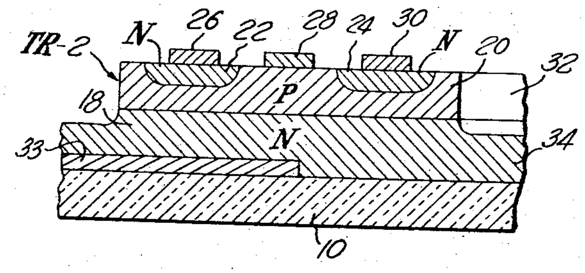

Formed in strip 12 is transistor TR–2 of the NPN type with a second N region diffused in the P-type base to form in effect a two-emitter transistor. A cross sectional view of TR–2 is shown in FIGURE 3. This double emitter structure actually provides one NPN transistor plus an integral diode formed by the additional diffused PN junction. TR–2 has an N-type collector region 18 provided by the crystal strip 12, a P-type base region 20 and two N-type emitter regions 22 and 24. Ohmic contacts 26, 28, and 30 are plated or evaporated onto their corresponding semiconductor layers. Output lead 32 is soldered or alloyed to substrate 10, and extends beneath the left-hand end of strip 12 and makes ohmic contact therewith, and thereby also with collector region 18 of TR–2. Double emitter transistor TR–3 is identical with TR–2.

Contiguous with base region 20 is a strip 32 of diffused P-type material in strip 12 and formed in a tortuous path to define a cross-coupling resistor $R_1$ having a value of 7 kilohms (K). The left-half 34 of crystal strip 12, a portion of which underlies P-strip 32, defines a bias resistor $R_2$ having a value of 5K. An ohmic contact 36 is formed on the other end of P-strip 32 to provide means for electrically connecting this end of $R_1$ to the output lead 38. Resistance $R_2$ is connected to the bias lead 40 which is mounted on substrate 10 and passes beneath strip 12 into ohmic contact therewith. P-strip 42 and its corresponding underlying end crystal portion 44 define resistors $R_3$ and $R_4$ in an identical manner. The distributed capacitance at the PN junctions formed by P-strips 32 and 42 with their underlying corresponding N-strip portions provide a distributed capacitance equivalent to capacitors $C_3$ and $C_4$, each having a value of 1000 micromicrofarads.

Also formed in N-strip 12 is the transistor TR–1 having a collector region defined by an area of strip 12, a diffused P-layer 45 (FIGURE 1) defining a base region and a diffused N-layer 46 defining an emitter region. An ohmic contact 48 is plated on the emitter layer 46 and an ohmic contact 50 is plated on the base layer 45 so that electrical leads may be interconnected between these contacts and other elements, as described below. In cross section, TR–1 is similar to FIGURE 3 with the exception that TR–1 has only one diffused emitter region instead of two. Even though TR–1 has the form of a transistor, it provides two junction diodes by means of its collector-base and emitter-base PN junctions. In this embodiment of the invention, the structure is utilized as two separate PN junction diodes $D_1$ and $D_4$ rather than to provide conventional transistor action.

Figure 6:
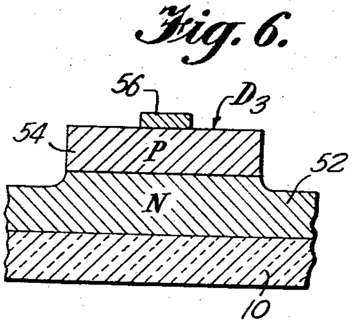

Also formed in strip 12 is a PN junction diode $D_3$, a cross sectional view of which is shown in FIGURE 6. This diode is formed by a diffused PN junction comprising the N-crystal portion 52 and the diffused P-layer 54 carrying an ohmic contact 56.

Figure 4:
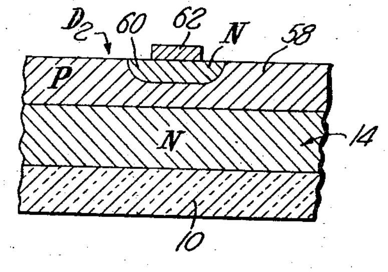

The P-layer 58 diffused into N-strip 14 is not etched away, and two N-layers are diffused into P-layer 58 to form identical junction diodes $D_2$ and $D_7$. A cross sectional view of diode $D_2$ is shown in FIGURE 4. In this case, the PN junction is formed between the diffused P-layer 58 and the diffused N-layer 60 with the N-strip 14 merely acting as a substrate. A metal contact 62 is plated on N-layer 60 to provide means for interconnecting the junction with other circuit components or leads.

Figure 5:
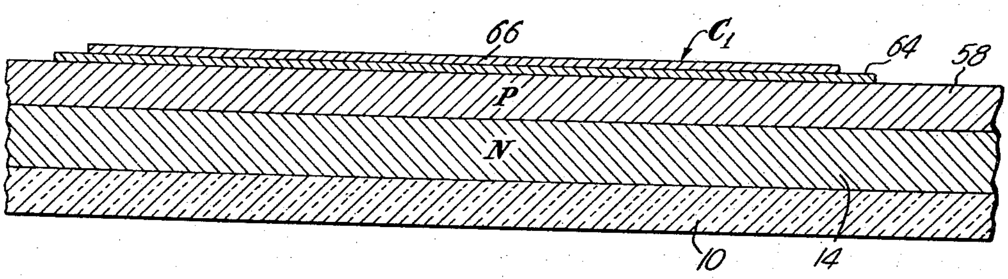

Also formed on strip 14 are two oxide-type coupling capacitors $C_1$ and $C_2$ formed as described in said pending application. As shown in FIGURE 5, oxide capacitor $C_1$ comprises a silicon dioxide coating 64 on P-layer 58. This coating acts as a dielectric for the capacitor $C_1$. A metal plate 66 is then plated on top of oxide coating 64 to complete formation of the capacitor. The capacitor is defined by the two conductors, P-layer 58 and metal plate 66, separated by the dielectric oxide coating 64.

Additional leads are attached to the substrate 10, and are utilized when this bistable multivibrator is connected as a part of a binary counter. These leads are as follows: input lead 68; clear lead 70; set lead 72; lockout lead 74; ground lead 76. External wires, as shown in FIGURE 1, interconnect the various circuit components with each other, and with the leads in a manner to provide bistable multivibrator operation.

The general operation of the circuit illustrated in FIGURE 1 and just described will be briefly described to provide a better understanding of the structure of the device of FIGURE 1. FIGURES 2*b* and 2*c* provide the same operation as FIGURE 2*a*, but differ in circuit design. Semiconductor networks could also be constructed to conform exactly with the circuits shown in FIGURES 2*b* and 2*c*. For example, the difference between FIGURES 2*a* and 2*b* involves diodes $D_1$, $D_4$, $D_5$, and $D_6$. These diodes are shown as separate circuit elements in FIGURE 2*b*, but are incorporated in other structures in FIGURE 2*a*. In FIGURE 2*a*, the diodes $D_1$ and $D_4$ are defined by the emitter-base and base-collector junction diodes respectively of TR–1, and diodes $D_5$ and $D_6$ of FIGURE 2*b* are incorporated in transistors TR–2 and TR–3 of FIGURE 2*a* in the form of second emitter-base junctions.

Another difference between FIGURES 2*a* and 2*b* is that the cross-coupling capacitors $C_3$ and $C_4$ of FIGURE 2*b* have been replaced by the distributed capacitance between their corresponding resistors $R_1$ and $R_2$, and $R_3$ and $R_4$. As described above with respect to the circuit of FIGURE 2*a*, $R_1$ and $R_3$ are formed by P-strips 32 and 42, respectively, and $R_2$ and $R_4$ are formed by N-crystal portions 34 and 44, respectively. Since the polarity across the capacitance thus formed is always the same, the junction-type distributed capacitance is satisfactory.

The difference between FIGURES 2*b* and 2*c* is that the 100K resistors $R_5$, $R_6$, $R_7$, and $R_8$ of FIGURE 2*c* are replaced by reverse-biased PN junction diodes $D_1$, $D_2$, $D_3$, and $D_4$, respectively, of FIGURE 2*b*. The purpose of these 100K resistors, shown in FIGURE 2*c*, is to supply current to reverse bias the diode gates $D_5$, $D_6$, $D_7$, and $D_8$. Although this multivibrator circuit could be constructed as a miniature semiconductor network to correspond exactly with the schematic illustrated in FIGURE 2*c*, semiconductor network techniques do not lend themselves as easily to providing high valued resistances such as the 100K resistors $R_5$–$R_8$, inclusive. In particular, 100K resistors require either very high resistivity semiconductor material or a large amount of space for a long path in lower resistivity material. Since the purpose of these resistors is to supply current to back bias diode gates, this current may also be obtained by replacing the resistors with reverse-biased PN junction diodes, effectively placing the diode gate and the biasing diode in series. Such substitutions result in the differences between the diagram shown in FIGURES 2*b* and 2*c*, the circuit shown in FIGURE 2*b* being much easier to construct by semiconductor network techniques. These substitutions have been checked by temperature cycling the semiconductor network multivibrator, and both the basic circuit of FIGURE 2*c* and the revised circuit of FIGURE 2*b* operate properly up to 110° C.

The preferred embodiment of the gated bistable multivibrator shown in FIGURE 2*a* is designed for use as one stage of a binary counter. The set input lead is utilized to determine which transistor will be initially conducting and which initially non-conducting. Since both TR–2 and TR–3 are NPN transistors, a positive pulse on the base of transistor TR–2 will render that transistor conducting and TR–3 non-conducting. Negative trigger pulses may then be applied to the input lead through diode $D_7$, coupling capacitor $C_1$ and diode $D_5$ to cut off transistor TR–2 and render transistor TR–3 conducting. A second trigger pulse will return the circuit to its original condition. Selective application of pulses to the lockout lead may lock out or block trigger pulses applied to the input lead to render the multivibrator circuit insensitive to input pulses. A positive polarity pulse applied to the clear lead will return the circuit to its original condition. Output 1 and output 2 supply output pulses indicative of the state of their corresponding transistor.

Therefore, FIGURE 2*a* illustrates a basic gated bistable multivibrator circuit digram which represents the operation of the semiconductor network of FIGURE 1. FIGURE 2*b* is the equivalent of FIGURE 2*c*, and also represents exactly the operation of FIGURE 1. However, in FIGURE 2*b*, the 100K resistors of 2*c* have been replaced by reverse-biased PN junction diodes. FIGURE 2*a* again is the full equivalent as far as operation is concerned of FIGURES 1, 2*b*, and 2*c*, but in order to adapt the circuit more easily to semiconductor network techniques, two separate diodes have been combined into a single transistor structure as collector-base and emitter-base diodes. In addition two other diodes have been replaced by an additional emitter-base junction in each of the switching transistors TR–2 and TR–3.

It must be emphasized here that only several preferred embodiments of this invention have been described above, and that other variations and modifications thereof may be made without departing from the scope of this invention, which is defined in the appended claims.

Thus, for example, since it is known that intrinsic semiconductor material is characterized by a relatively high order of resistivity, the substrate could be formed therefrom; or, the entire unit could be formed from a block of intrinsic semiconductor material into which doping impurities are diffused in the regions occupied by the cut wafers in the drawing. According to this arrangement, Item 10 of FIGURE 1 would be either a separate block of intrinsic material on which wafers 12 and 14 were mounted, or it would be part of the same physical piece of semiconductor material as areas 12 and 14, the latter differing therefrom only in electrical characteristics due to impurity doping.

What is claimed is:

1. A circuit device comprising a wafer of semiconductor material having first and second regions each with both N- and P-type conductivity material and defining a pair of diodes, a third region defining one electrode of a capacitor, and a conducting film mounted upon said third region in capacitive relationship thereto thereby to constitute the second electrode of said capacitor, said wafer of semiconductor material serving to make ohmic electrical connection between said third region and one of the electrodes of each diode in said pair of diodes.

2. A circuit device having a plurality of regions of semiconductor material, first and second ones of said regions each having both N- and P-type conductivity material and defining a pair of diodes, a third one of said regions defining one electrode of a first capacitor, a fourth one of said regions defining one electrode of a second capacitor, and conducting films mounted upon said third one of said regions and said fourth one of said regions in separate capacitive relationships therewith to respectively define the other electrode of said first capacitor and the other electrode of said second capacitor and a fifth one of said regions contiguous to said first, second, third, and fourth ones of said regions for making ohmic electrical connection therebetween.

3. A circuit device comprising a wafer of semiconductor material principally of a predetermined conductivity type with regions therein of differing conductivity type and resistivities, said wafer of said principal conductivity type with said regions therein of differing conductivity type and resistivities defining a transistor and a pair of distributed capacitance resistors, said transistor having an emitter base, and collector, the first resistive portion of the first one of said pair of distributed capacitance resistors being contiguous to and of material homogeneous with the collector of said transistor and the remaining resistive portion being separated from said first resistive portion by a PN junction said remaining resistive portion being formed as a layer in said wafer within the region defined by said first resistive portion, and external electrical connections to the emitter, base, and collector of said transistor, and to one of the terminal ends of said second resistive portion.

4. A miniature semiconductor device providing bistable multivibrator action comprising a body of semiconductor material of one conductivity type, at least two junction transistors formed in said body each having an emitter region of said one type conductivity, a base region of opposite type conductivity and a collector region defined by an area of said body, a portion of said body contiguous to each said area defining a bias resistor, a layer of said opposite type conductivity material overlying each said portion, said layer being contiguous to said base region and defining a cross-coupling resistor, means including each said cross-coupling resistor for interconnecting the base region of each transistor and the collector region of the other transistor, means to apply a bias voltage to each said portion and means to apply trigger pulses to each base region to provide a bistable multivibrator action.

5. A miniature semiconductor device as recited in claim 4 wherein each layer and portion define a cross-coupling capacitor by virtue of the distributed capacitance of the junction therebetween.

6. A miniature semiconductor device providing a gated bistable multivibrator comprising a body of semiconductor material of one type conductivity, said body including a first portion, a pair of junction transistors formed in said first portion each having a collector region defined by an area of said first portion, a base region of opposite conductivity type semiconductor material diffused in said collector region and an emitter region of said one type conductivity diffused in said base region, a section of said first portion contiguous to each said area defining a bias resistor, a layer of said opposite type material diffused into each section and defining a cross-coupling resistor, a second emitter region diffused in each base region defining a P-N junction diode gate, means for back biasing each said junction, means to apply a bias voltage to said each section, and input means for applying trigger pulses to said second emitter regions to provide gated bistable multivibrator action.

7. A miniature semiconductor device as recited in claim 6 in which said body includes a second portion substantially electrically isolated from said first portion and having a second diffused layer of said opposite type conductivity therein, a layer of said one type conductivity material diffused in said second layer to form therein a P-N junction input diode means to reverse bias said input diode, said input diode being connected between said diode gates and said input means.

8. A miniature semiconductor device as recited in claim 7 further including two spaced coatings of dielectric material on said second diffused layer of opposite type conductivity, and a metal plate fixed to each coating, thereby defining two input capacitors, each of said capacitors being connected between a different one of said diode gates and said input diode.

9. A miniature semiconductor device comprising a body of semiconductor material of one type conductivity, a first diffused layer of opposite type conductivity material in said body forming a P-N junction, second and third spaced layers of said one type conductivity material diffused in said first layer thereby forming a double emitter transistor structure having a collector region in said body, a base region in said first layer, and an emitter region in each of said second and third layers, said collector, base, and one of said emitter regions being connected to provide transistor action, the second of said emitter regions defining a second P-N junction diode with said base region, means for back biasing said second junction diode, and means for applying signals through said second junction diode to said base region of said transistor to initiate said transistor action.

10. A semiconductor device comprising:

(a) a wafer of semiconductor material, (b) at least two junction transistors formed in said water by layers of semiconductor material, each transistor having an emitter region of one conductivity-type, a base region of the opposite conductivity-type, and a collector region of said one conductivity-type, (c) at least two elongated regions of the wafer of the same conductvity-type laterally spaced along their lengths from one another and from the transistors, each of the elongated regions providing a load resistor for one of the transistors, (d) at least two conductive means external of the semiconductor material, each of these at least two conductive means making low resistance electrical contact to the collector region of a different one of the transistors and to an end of a different one of said elongated regions, (e) means to supply operating bias potential between ends of the elongated regions and the emitter regions of the transistors, (f) at least two elongated diffused surface portions of the wafer each composed of semiconductor material of said opposite conductivity-type, each of the surface portions having an end part electrically connected to the base region of a different one of the transistors and providing a base resistor therefor, the surface portions being isolated from the elongated regions by P-N junctions, (g) means including at least one of said surface portions for interconnecting the base region of at least one of the transistors to the collector region of another of the transistors to provide collector-to-base coupling.

11. Apparatus according to claim 10 wherein said end part of each of the surface portions is integrally connected through the semiconductor material to the base region of the associated transistor.

12. Apparatus according to claim 11 wherein said elongated regions are integrally connected to one another at a common end and the means to supply operating bias potential is connected to this common end.

13. A miniature semiconductor device comprising:

(a) a body of extrinsic semiconductor material, (b) a pair of junction transistors formed in said body, each transistor having an emitter region of one conductivity-type, a base region of opposite conductivity-type and a collector region of said one conductivity-type, (c) an elongated portion of said body laterally spaced along its length away from the collector regions, (d) a pair of conductive means each engaging in common the collector region of a different one of said transistors and an end of said elongated portion, (e) means to apply operating bias between a central part of said elongated portion and the emitter regions of the transistors, (f) a pair of surface layers defined in said body laterally spaced from one another each being composed of semiconductor material of said opposite conductivity-type, each of said layers having one end portion contiguous to the base region of a different one of the transistors and having a remote end portion laterally spaced from such base region, (g) means for electrically connecting the collector region of each of the pair of transistors to the remote end portion of the surface layer associated with the other transistor.

14. In an integrated semiconductor circuit wherein at least two transistors are provided laterally spaced from one another adjacent a major face of a wafer of semiconductor material:

(a) a plurality of diffused surface portions of the wafer adjacent said major face, each surface portion having one end integrally connected to the base region of a different one of the transistors and having a remote end laterally spaced from such base region, (b) at least two elongated regions of the wafer laterally spaced along their lengths from one another and from the transistors, each of the elongated regions having an end electrically connected to the collector of a different one of the transistors, the elongated regions being isolated from the surface portions by P-N junctions, (c) and coupling means connecting the collector of at least one of the transistors to the remote end of one of said surface portions, 15. A semiconductor integrated circuit device comprising:

(a) a thin wafer of monocrystalline semiconductor material;

(b) a plurality of junction transistors formed in the wafer adjacent one major face thereof by layers of the semiconductor material of alternating conductivity types, each transistor having an emitter region of one conductivity type, a base region of opposite conductivity type, and a collector region of said one conductivity type, at least two of said transistor regions extending solely to said one major face, the transistors being laterally spaced from one another along said one major face;

(c) said wafer having a plurality of elongated regions of a given conductivity type, each of said elongated regions being laterally spaced and separated along said one major face for at least the major portion of the length of the elongated region from the transistors, each elongated region having an outer surface extending to said one major face and there occupying only a limited area of such major face, means for interconnecting at least one of the elongated regions with one of said transistors for said one of the elongated regions to act as a load resistor for said one of the transistors;

(d) a pair of conductive means extending externally of the semiconductor material, each of this pair of conductive means making low resistance electrical contact on a major face of the wafer to the collector region of a different one of the transistors, at least one of the conductive means also making electrical contact to an end of at least one of the elongated regions;

(e) means to supply operating bias potential between the other end of said at least one of the elongated regions and the emitter regions of the transistors;

(f) a plurality of elongated diffused surface portions of the wafer adjacent said one major face, each surface portion composed of semiconductor material of conductivity type opposite to that immediately underlying such surface portion, the surface portions occupying only a limited area of said one major face, means electrically connecting an end part of at least one of the surface portions with one of the base, emitter and collector regions of another of the transistors to provide a series resistor therefor; and (g) the diffused surface portions being electrically isolated from the elongated regions and from one another by P-N junctions.

16. A device as in claim 15 wherein means including said at least one of the surface portions interconnects the base region of said another of the transistors to the collector region of said one of the transistors to provide collector-to-base coupling.

17. A device according to claim 15 wherein at least two of said elongated regions are integrally connected to one another at a common end, and the means to supply operating bias potential is connected to this common end.

18. In a semiconductor integrated circuit device wherein a plurality of junction transistors are provided in a semiconductor wafer adjacent one major face thereof laterally spaced and separated from one another along said major face:

(a) a plurality of elongated diffused surface portions of the wafer adjacent said one major face, each portion composed of semiconductor material of conductivity type opposite to that immediately underlying such surface portion, each portion having an outer surface lying on said one major face and there occupying only a limited area of the one major face, means electrically connecting an end part of each diffused portion with a region of a different one of the transistors whereby said diffused portion acts as a resistor in series with said region of said different one of the transistors;

(b) means adherent to said one major face of the wafer for making electrical connection to the other ends of each of the elongated surface portions;

(c) a plurality of elongated regions of the wafer composed of semiconductor material of a given conductivity type, each elongated region having an outer surface lying on said one major face and there occupying only a limited area of the one major face, means electrically connecting an end part of each elongated region with a region of a different one of the transistors whereby the elongated regions act as a resistor in series with the transistor regions;

(d) means adherent to a major face of the wafer for making electrical connection to the other end of each of the elongated regions;

(e) the elongated diffused surface portions being electrically isolated, with respect to direct currents through the semiconductor material, from one another and from each elongated region, the electrical isolation being provided by P-N junctions in the wafer.

19. A semiconductor integrated circuit device comprising:

(a) a wafer of monocrystalline semiconductor material;

(b) a plurality of P-N junction transistors formed in the wafer adjacent one major face thereof by overlying layers of the semiconductor material of alternate conductivity types, each transistor having base, emitter and collector regions formed by said alternating layers, the transistors being laterally spaced along said one major face; at least two of said alternating conductivity layers of each transistor extending solely to said one major face and occupying only a limited area of said one major face;

(c) a plurality of elongated diffused surface regions defined in the wafer adjacent said one major face, each elongated region being composed of semiconductor material of conductivity type opposite to that immediately underlying such elongated region, the major portion of the lengths of said elongated regions being laterally spaced and separated from one another and from the transistors along said one major face, each elongated region occupying only a limited area of said one major face, means electrically connecting end portions of at least two of the elongated regions with selected ones of said regions of the transistors for said elongated regions to act as resistors in circuit with said transistors;

(d) at least two of the elongated regions being electrically isolated, with respect to direct currents through the wafer, from one another for at least the major portion of the lengths of said elongated regions, the electrical isolation being provided by P-N junctions within the wafer, said P-N junctions extending solely to the said one major face and surrounding at least the said major portion of the lengths of said elongated regions;

(e) means including contacts adherent to the wafer for applying operating bias potential across the emitter and collector regions of at least two of the transistors; and (f) means including contacts adherent to the wafer for applying variable potentials to the base regions of at least two of the transistors to control the conductive conditions thereof.

References Cited

UNITED STATES PATENTS

| | | | |
|---|---|---|---|
| 2,791,759 | 5/1957 | Brown | 307—88.5 |
| 2,816,228 | 12/1957 | Johnson | 331—104 |
| 2,856,544 | 10/1958 | Ross | 307—88.5 |
| 2,875,505 | 3/1959 | Pfann | 29—253 |
| 2,897,377 | 7/1959 | Nelson et al. | 307—88.5 |
| 2,898,477 | 8/1959 | Hoesterey | 307—88.5 |
| 2,911,539 | 11/1959 | Tannenbaum | 250—211 |
| 2,964,648 | 12/1960 | Doucette et al. | 317—242 |
| 2,967,952 | 1/1961 | Shockley | 307—88.5 |
| 2,994,834 | 8/1961 | Jones | 330—39 |
| 3,005,937 | 10/1961 | Wallmark et al. | 317—235 |
| 3,022,472 | 2/1962 | Tannenbaum et al. | 333—18 |
| 3,029,366 | 4/1962 | Lehovec | 317—101 |

ARTHUR GAUSS, *Primary Examiner.*

JOHN S. HEYMAN, *Assistant Examiner.*